United States Patent [19]
Gillingham

[11] Patent Number: 5,612,912
[45] Date of Patent: Mar. 18, 1997

[54] METHOD OF MULTILEVEL DRAM SENSE AND RESTORE

[75] Inventor: Peter B. Gillingham, Kanata, Canada

[73] Assignee: Mosaid Technologies Incorporated, Kanata, Canada

[21] Appl. No.: 584,887

[22] Filed: Jan. 11, 1996

Related U.S. Application Data

[63] Continuation-in-part of Ser. No. 366,921, Dec. 30, 1994, Pat. No. 5,532,955.

[51] Int. Cl.$^6$ ............................................. G11C 11/46
[52] U.S. Cl. .................... 365/168; 365/149; 365/203; 365/210; 365/230.03
[58] Field of Search ............................. 365/149, 230.03, 365/203, 210, 168

[56] References Cited

U.S. PATENT DOCUMENTS

| | | | |
|---|---|---|---|
| 4,287,570 | 9/1981 | Stark | 365/104 |
| 4,415,992 | 11/1983 | Adlhoch | 365/94 |
| 4,661,929 | 4/1987 | Aoki et al. | 365/189 |
| 4,771,404 | 9/1988 | Mano et al. | 365/189 |
| 4,926,382 | 5/1990 | Sakui et al. | 365/210 |
| 5,184,324 | 2/1993 | Ohta | 365/149 |
| 5,283,761 | 2/1994 | Gillingham | 365/189 |
| 5,293,563 | 3/1994 | Ohta | 365/190 |
| 5,495,440 | 2/1996 | Asakura | 365/149 |
| 5,532,955 | 7/1996 | Gillingham | 365/203 |
| 5,537,347 | 7/1996 | Shiratake et al. | 365/149 |

OTHER PUBLICATIONS

Ohta, Yoshiji et al., Symposium, "A Novel Memory Cell Architecture for High–Density DRAMs," VLSI Circuits, May 1989, pp. 101–102.

Primary Examiner—Joseph E. Clawson, Jr.
Attorney, Agent, or Firm—Hamilton, Brook, Smith & Reynolds, P.C.

[57] ABSTRACT

In a multi-level DRAM, one of multiple voltage levels may be stored in each memory cell. In a four-level system, each of a pair of bitlines is divided into two subbitlines which are connected to respective sense amplifiers. Dummy cells matching the storage cell are provided on each subbitline to balance the capacitances of the subbitlines. The stored voltage is dumped onto left and right subbitlines which are then isolated, and one of the voltages is then sensed to provide a sign bit. A second reference level is generated by dumping the charge associated with the sign bit over three subbitlines and the magnitude bit is sensed using that reference. The stored voltage is restored by charge sharing a sign bit charge on two bitlines with a magnitude bit charge on one bitline.

24 Claims, 9 Drawing Sheets

FIG. 1

| FIG. 1A | FIG. 1B |

METHOD OF MULTILEVEL DRAM SENSE AND RESTORE

BACKGROUND OF THE INVENTION

This is a Continuation-in-Part application of U.S. Ser. No. 08/366,921, filed Dec. 30, 1994 U.S. Pat. No. 5,532,955 the teachings of which is incorporated herein by reference in its entirety.

FIELD OF THE INVENTION

This invention relates to dynamic random access memories (DRAMs), and in particular to a method of storing a variable signal in each cell of a DRAM for representing more than one bit in each cell.

BACKGROUND TO THE INVENTION

In a DRAM multiple-bit-level storage design described in U.S. Pat. No. 5,283,761, invented by Peter Gillingham, a voltage stored in a memory cell may be one of four levels. To read the stored voltage, charge stored in the memory cell is dumped onto a bitline to create a data voltage, and the data voltage is sensed relative to a first reference voltage to provide a sign bit and relative to a second reference voltage, determined by the sign bit, to provide a magnitude bit. The first reference is a voltage level midway between a highest and a lowest of four levels. The second reference voltage is set to be higher than the lowest and lower than the next highest of the four levels in the event that the data voltage is below the midway voltage level, and set to a voltage higher than the second highest and lower than the highest of the four levels in the event that the data voltage is above the midway point. To that end, a high level charge dependent on the sensed sign bit and stored on a dummy capacitor matching a storage capacitor is dumped onto three bitlines and onto a capacitor of half the capacitance of the storage capacitor. The data voltage is then sensed as to whether it is higher or lower in voltage than the dumped voltage on a reference bitline (providing the magnitude bit), whereby the data bit is read as one of the four levels.

To restore the charge to the memory cell, either a full logic level is written to the cell, or an attenuated version thereof, depending on whether the data voltage was either the highest or lowest, or the second lowest or second highest values respectively. This required a circuit which attenuated a voltage conditionally based on the value of sensed data. Such a circuit is difficult to implement in the tight pitch of a DRAM sense amplifier.

The description of U.S. Pat. No. 5,283,761 is incorporated herein by reference.

SUMMARY OF THE INVENTION

In a method of the present invention, a stored charge is dumped from a storage capacitor onto plural capacitively matched subbitlines to provide a sensing voltage. That voltage is sensed relative to a first reference level. A second reference level is generated by dumping a charge from a capacitor, preferably the storage capacitor, onto plural capacitively matched subbitlines. The level of the sensing voltage is then sensed relative to the second reference level.

More specifically, a random access memory embodying the invention is able to store one of multiple levels in each of a plurality of memory cells. The memory comprises columns of memory cells, the cells comprising storage capacitors coupled to bitlines through switches for reading and writing data from and to the memory cells. Sense amplifiers are coupled as voltage sensors to adjacent bitline pairs. The bitlines are divided into subbitlines by switches, and subbitlines of adjacent bitlines are coupled by switches. A dummy capacitor matching a storage capacitor is coupled to each subbitline through a switch such that the capacitance of each subbitline with dummy connected thereto matches the capacitance of a subbitline having a storage capacitor connected thereto. The subbitlines are selectively connected through switches, and storage capacitors and dummy capacitors are selectively connected to subbitlines through switches, to read data stored on memory cells. In particular, a stored charge is dumped from a storage capacitor to a subbitline and through a switch to another capacitively matched subbitline to establish a sensing voltage on plural subbitlines. The voltage on one subbitline is sensed against a first reference voltage to identify a sign bit. A second reference voltage is generated by dumping a charge from a capacitor onto plural capacitively matched subbitlines and used to identify a magnitude bit.

To offset noise in the sensing voltage due to capacitive coupling from the rising word line, a subbitline is first precharged with a dummy capacitor connected thereto. The dummy capacitor is disconnected from the subbitline prior to connection of the storage capacitor to the subbitline.

To more closely match the attenuation of the generated reference voltage to the attenuation of the stored data value, the sensing voltage for sensing a magnitude bit is stored on a dummy capacitor, and the original storage capacitor dumps charge to provide the reference voltage.

Preferably, the voltage to be written to a storage capacitor is generated by charging plural subbitlines with capacitors to high or low voltage levels and connecting the subbitlines to share charge. The number of subbitlines thus charged is dependent on the binary weights of multiple bits corresponding to the multiple levels. The voltage levels are dependent on the specific bit values corresponding to the multilevel voltage to be stored.

In a preferred system for storing one of four levels in each of the memory cells, each bitline is divided into two subbitlines. Each subbitline is coupled through switches to each adjacent subbitline and to each diagonal subbitline of a bitline pair. A sensor is coupled to each bitline pair at each end thereof. The reference voltage for sensing the magnitude bit is generated by dumping a charge corresponding to the sign bit onto three subbitlines. The voltage to be written to a storage capacitor is generated by storing charge corresponding to the value of a sign bit onto two subbitlines and storing the charge corresponding to the value of a magnitude bit onto one subbitline. The three charges are shared by connecting the three subbitlines, and the resultant voltage is stored on the storage capacitor.

BRIEF INTRODUCTION TO THE DRAWINGS

A better understanding of the invention will be obtained by reading the description of the invention below, with reference to the following drawings, in which.

DETAILED DESCRIPTION OF THE INVENTION

In the preferred embodiment of the present invention two bits of data are encoded as one of four voltage levels stored in and retrieved from a single DRAM memory cell, though a system may be designed to store additional voltage levels. The four data levels and sense amplifier reference levels are created through simple charge redistribution techniques on local bitlines. A second sense amplifier and several additional switches are added to each column in a standard folded bitline DRAM architecture to implement this technique. The resulting structure can operate as a standard 1 bit/cell DRAM with virtually no degradation in performance by simply altering the control sequences.

One of the four voltage levels $\Delta$ shown in Table 1, representing two bits of information, is stored in each memory cell. Three reference levels $R_i$ are necessary to distinguish between the four combinations of sign (S) and magnitude (M) bits. The noise margin is one-third that of standard 1 bit/cell DRAM.

Sensing of the two bits is performed sequentially, first the sign bit and then the magnitude bit. The sign bit is used to create the reference level for the magnitude sense operation. After sensing, the sign and magnitude data can be accessed through high speed page mode operations identical to standard DRAM. Four level data is restored to the memory cell by charge sharing bitlines holding sign and magnitude data.

TABLE 1

| i | $R_i$ | Reference and Data Voltage Levels $\Delta$ | S | M |
|---|---|---|---|---|
| +1 | 5Vdd/6 | Vdd | 1 | 1 |
| 0 | Vdd/2 | 2Vdd/3 | 1 | 0 |
| −1 | Vdd/6 | Vdd/3 | 0 | 1 |
|  |  | 0 | 0 | 0 |

Figure 1:
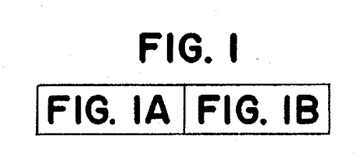
FIGS. 1A and 1B are an electrical schematic diagram of a multilevel DRAM array circuit embodying the present invention.
Figure 1A:
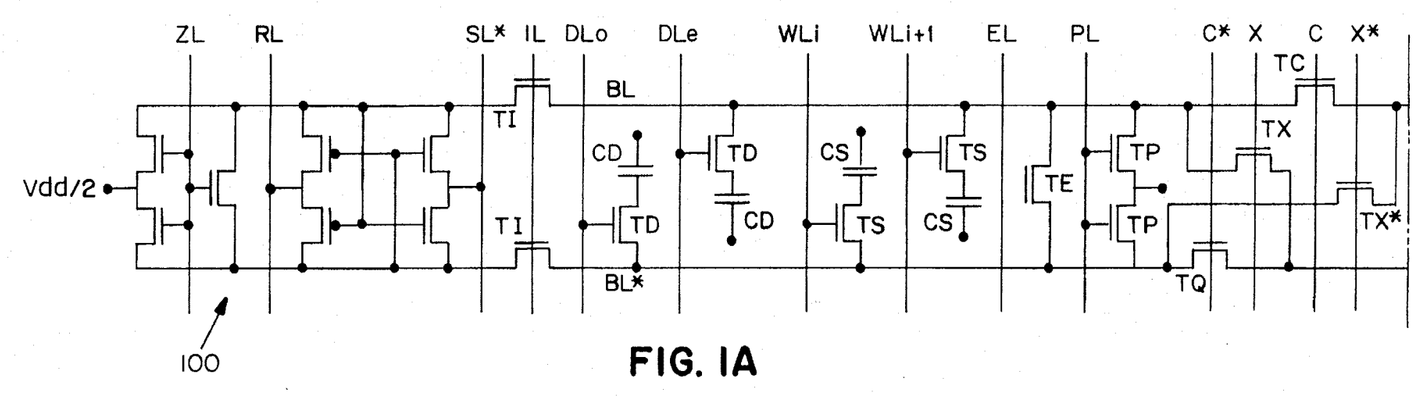
Figure 1B:
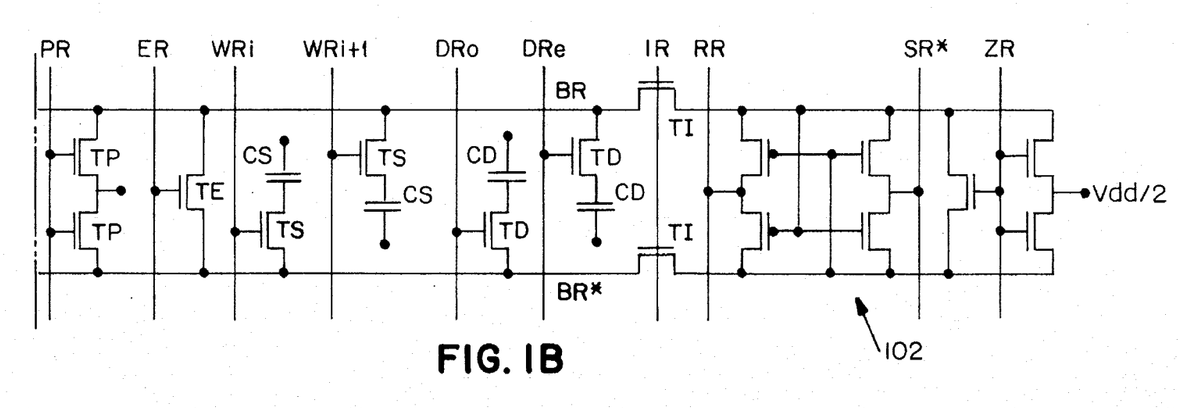
Figure 2:
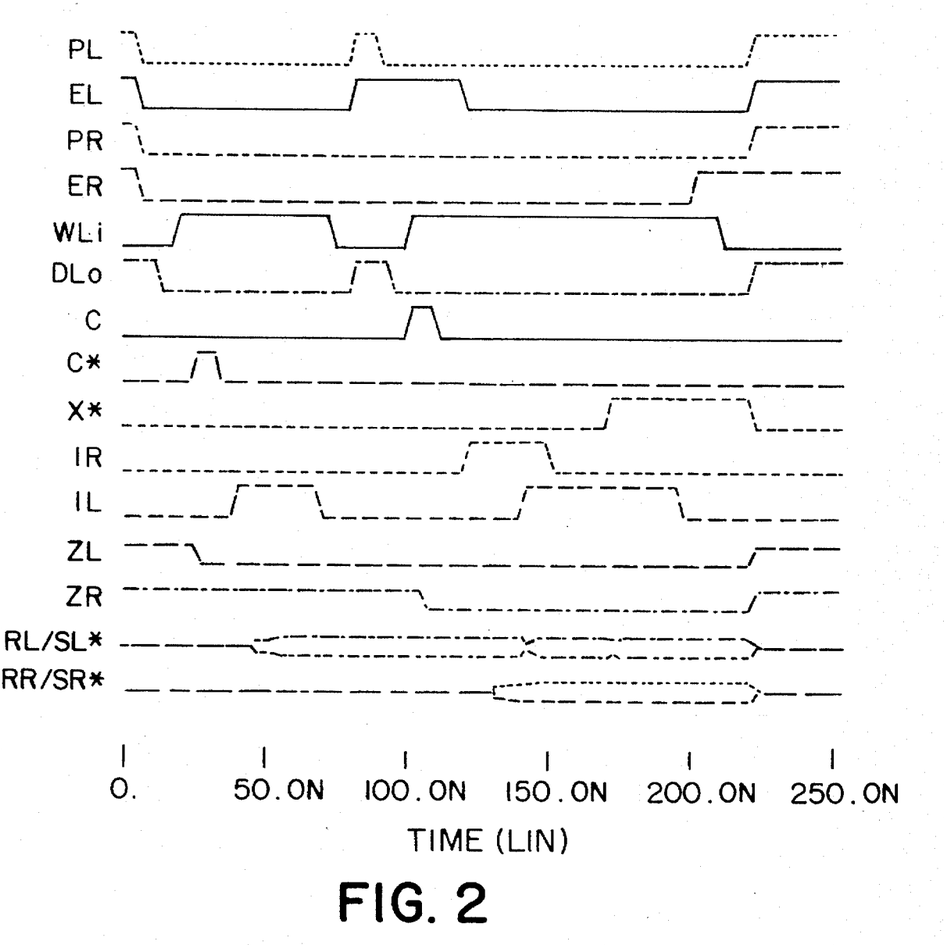
FIG. 2 is a timing diagram of signals in the circuitry of FIG. 1.

FIG. 1A and 1B shows the circuit schematic of a single column of multilevel DRAM. Signals and devices to the left and right are designated by the letters L and R, respectively. Each bitline B and B* is divided into two equal subbitlines BL, BR and BL*, BR* which can be connected by n-channel pass transistors TC and TC* controlled by signals C and C*. Diagonally opposite subbitlines can be connected by n-channel pass devices TX and TX* controlled by X and X*. Although only one memory cell CS, TS is shown coupled to each subbitline it will be recognized that an array of cells would be coupled to each, and there would be an array of columns. The pair of subbitlines on the left (BL,BL*) and on the right (BR,BR*) can be connected to sense amplifiers 100 and 102, respectively, by asserting the sense amp isolation signals IL and IR to the isolation devices TI. Sense amp isolation devices TI also allow sense amplifiers 100 and 102 to be shared with adjacent arrays to save chip area. Subbitline pairs can be independently shorted together by equalize signals EL and ER applied to devices TE and can be precharged to a Vdd/2 voltage by precharge signals PL and PR applied to devices TP.

Each subbitline has a dummy memory cell of capacitor CD and access transistor TD. The dummy cells match the storage cells and are used to balance the capacitance seen on all subbitlines throughout the sense and restore operation. Odd and even dummy word lines DLo, DLe, DRo, and DRe are normally enabled. Before a word line $WL_i$ or $WR_i$ selected to enable an access transistor TS, the dummy word line on the corresponding subbitline is turned off.

Word lines and other signals controlling n-channel pass devices must be raised to a level higher then Vdd in order to pass a full "1" level. A Vpp level is defined as a voltage sufficiently high to turn on an n-channel device having back-bias and a source voltage equal to Vdd.

An overview of the operation of the circuit of FIGS. 1A and 1B is as follows. It will be assumed that the memory cell enabled by word line WLi is to be read and restored; however, any memory cell on any of the subbitlines may be similarly accessed.

The charge stored on the storage capacitor CS is dumped onto the subbitline BL*, without dummy cell connected, and the subbitline BR*, with dummy cell connected, to provide sensing voltages on the subbitlines for separately sensing the sign and magnitude bits representing the multilevel stored charge. The two subbitlines are then isolated by transistor TC*, and the sign bit, which indicates whether the stored charge is above or below the Vdd/2 mid level, is sensed by the left sensor 100.

In order to sense the magnitude bit, a second reference level, either above or below Vdd/2 depending on the sign bit, must be provided on subbitline BR. That reference level is obtained by appropriate charge dumping of the sign bit from the storage capacitor CS. With sensing of the level on BR* relative to the generated reference level on BR, the right sense amplifier 102 provides the magnitude bit.

In order to regenerate the voltage to be restored on the storage capacitor CD, the sign and magnitude bits are appropriately shared on three subbitlines including BL*.

A more detailed description of memory operations will now be presented. Referring to the timing diagram in FIGS. 1A and 1B, bitlines are initially precharged and held to a Vdd/2 reference level by control signal ER, PR, EL, and PL. The Vdd/2 reference level could also be created through charge sharing by equalizing fully realized bitlines at the beginning of the active cycle. A reference level generated in this way would better track the 4-level data stored in the cell, which is also generated by bitline charge sharing as explained later. However, memory access would be slower if this method of Vdd/2 reference level generation were employed.

To read the data in a particular memory cell (the one controlled by word line Wli, for example) the appropriate dummy word line (DLo) is first deactivated at time t=12 ns. (Specific times are provided as examples only.) Then, word line WLi is raised at time t=18 ns to dump 4-level data from the memory cell onto the subbitline BL*. By sequencing the word lines in this way, the capacitive coupling from the falling dummy word line to the floating subbitline is offset by the coupling from the rising normal word line, and a balanced subbitline capacitance is maintained. Because of the small signal margins in multi-level DRAM, it is particularly important to compensate for such coupling which affects subbitlines within a pair unequally. In addition to word lines, subbitline connect (C, C*) and cross-connect (X, X*) signals must be employed carefully to minimize unbalanced coupling. Common mode signals such as bitline equalize (EL, ER) and sense-amp isolation (IL, IR) do not deteriorate the signal because of the balanced nature of the folded bitline architecture.

A switch is closed momentarily from time t=24 ns to t=33 ns by the appropriate control signal (C*) to distribute cell charge to the opposite subbitline BR*, where it is held for further processing. The sense amplifier is then connected to the pair of subbitlines by raising the sense amp isolation control signal (IL). The sign bit (S) is then sensed by asserting sense and restore clocks SL* and RL at time t=45 ns. Note that sense and restore clocks are initially precharged to Vdd/2.

One of two reference levels $r_i$, where i=+1 or −1, is now required to sense the magnitude bit. The reference level required is determined by the value of the sign bit sensed in the preceding operation. With reference to Table 1, it can be seen that, if the full stored voltage $\Delta$ were held on the subbitline BR and its associated dummy capacitor CD, $r_i$ would be equal to $R_i$ of 5Vdd/6 or Vdd/6, depending on whether the sign bit is a 1 or a 0. However, dumping of the stored charge from CS onto the bitline results in an attenuation of either voltage toward Vdd/2. In sensing the sign bit, that attenuation did not affect the required mid-level reference value of Vdd/2. However, in distinguishing between two levels which are both above or below the mid level and which are attenuated toward the mid level, the reference level between the two levels must also be attenuated.

The attenuation is proportional to Cc/2Cb where Cc is the capacitance of the storage cell including capacitor CS and Cb is the capacitance of each subbitline, including the connected storage capacitor or dummy capacitor. The two subbitline capacitances on which the stored charge is dumped are matched because a dummy capacitance connected to BR* matches the storage capacitance connected to BL*.

The reference level ri can thus be defined as the result of dumping a Vdd/6 or 5Vdd/6 level stored in a memory cell onto two subbitlines in order to mimic the Cc/2Cb attenuation that the data experiences. Thus:

$$r_i=(R_i-Vdd/2)Cc/2Cb+Vdd/2$$

To eliminate the requirement for 5Vdd/6 and Vdd/6 voltage references, the desired reference levels can be created by dumping full level (Vdd or Vss) cell data corresponding to the value of the sign bit onto three subbitlines. That solution can be seen intuitively by referring to Table 1. Note that the difference between Vdd or 0 and the precharge voltage Vdd/2 is 50% higher than the difference between 5Vdd/6 or Vdd/6 and the precharge voltage. Distributing a 50% higher charge difference over a 50% greater number of bitlines results in the same resultant voltage. Thus one can take the full Vdd level sign bit and distribute it over three subbitlines, with associated storage or dummy capacitors, to obtain the required attenuated reference level of distributing Ri over two subbitlines. Mathematically:

$$r_i=(R_i-Vdd/2)Cc/2Cb+Vdd/2=(S-Vdd/2)\ Cc/3Cb+Vdd/2$$

where $R_i$=5Vdd/6 or Vdd/6, S=Vdd or 0

To that end, the selected word line (WLi) is deactivated at time t=73 ns to store the sign bit, and then the bitlines are precharged to Vdd/2 by asserting the equalize and precharge control signals (EL,PL). The dummy word line (DLo) is reactivated in preparation for the reference level generation operation. Note that the same memory cell in which the original data was stored is used to generate the reference level for sensing the magnitude bit. This eliminates one source of component mismatch error in multi-level sensing.

The bitline precharge control signal (PL) is then deactivated at time t=90 ns, while the equalize signal (EL) remains active, shorting the two subbitlines BL and BL*. The dummy word line (DLo) is then deactivated and the word line (WLi) and bitline connect signal (C) are activated to dump the sign bit onto the three subbitlines BL, BL* and BR, creating the appropriate reference level on BR. The bitline connect signal is then deactivated to fully isolate the right pair of subbitlines holding the original cell data on BR* and the generated reference level on BR. The magnitude bit is then sensed in the normal manner, by turning on the right sense amp isolation devices controlled by signal IR, and then asserting sense and restore clocks SR* and RR* at time t=130 ns. At this point, the sign bit and the magnitude bit are available at the sense amps for fast page mode access. The left sense amplifier holding the sign bit is reconnected to the subbitline pair by reasserting control signal IL at time t=143 ns, so that write data will be transferred to the bitlines.

To restore four level data to the memory cell we note that a full Vdd or Vss level is required when sign and magnitude bits have the same value. When sign and magnitude bits differ, an intermediate voltage in which the sign bit is weighted ⅔ and the magnitude bit is weighted by ⅓ is required. In the prior Gillingham patent, one of the two operations was conditionally selected, depending on whether the bits differed. In the present system, the logic required to make that decision is avoided. It is recognized that the restore levels $\Delta$ can be established by charging two subbitlines to a full Vdd or Vss level represented by the sign bit, and a single subbitline to a full level represented by the magnitude bit, and then unconditionally charge sharing the three subbitlines:

$$\Delta=2S/3+M/3,$$

where S=Vdd or 0, M=Vdd or 0

TABLE 2

| S | M | $\Delta$ |
|---|---|---|
| 1 | 1 | $\frac{2Vdd}{3}+\frac{Vdd}{3}=Vdd$ |
| 1 | 0 | $\frac{2Vdd}{3}+0=\frac{2Vdd}{3}$ |
| 0 | 1 | $0+\frac{Vdd}{3}=\frac{Vdd}{3}$ |
| 0 | 0 | $0+0=0$ |

Restore is accomplished by first disconnecting the sense amplifier holding the magnitude from the subbitlines by deasserting the sense amplifier isolation control signal IR. The sign bit S is then transferred to the subbitline BR holding the magnitude bit complement M*, by asserting the appropriate control signal (X*) at time t=170 ns, connecting diagonally opposite subbitlines BL* and BR. The left sense amplifier that holds the sign bit is able to drive this load without risk of changing state since the result of capacitive charge sharing on one terminal can be no worse than Vdd/2 while the other terminal will remain S*. Once bitlines BL* and BR have been fully charged to S, the sense-amp isolation control signal IL is deactivated to disconnect the sense amplifier holding the sign bit from the bitlines. The bitline equalization control sign (ER) is asserted at time t=200 NS, to short the three subbitlines BL*, BR and BR* and generate one of four levels to restore to the memory cell.

The word line (WLi) is then deactivated to capture this level in the memory cell. At this point all control signals are returned to their precharge states, precharging the bitlines in anticipation of the next memory cycle.

The reliability of data storage and soft error immunity of Multi-level DRAM can be tailored by selecting the number of cells connected to each subbitline for the desired Cc/Cb ratio. A standard 1 bit/cell, folded-bitline DRAM array can be converted to a 2 bit/cell Multi-level DRAM with the addition of an extra set of sense amplifiers, dummy cells, and control circuits, and by splitting the bitlines to insert the additional switches. In a typical 16M DRAM with 128 cells/bitline, the extra components would add less than 20% to the chip area. Multi-level DRAM is more sensitive to noise and component mismatch. The use of offset voltage compensated sense amplifiers can improve sense accuracy.

Another embodiment is illustrated with reference to FIGS. 3–14. A folded bitline is illustrated, which is comprised of conductor pairs BL, BL* and BR, BR*, connected via the source drain circuits of FETs 1 and 3. The gate of FET 1 is enabled by a logic signal C, and the gate of FET 3 is enabled by a logic signal C*, both of which can be either Vdd or Vpp (at least Vdd+Vtn, where Vtn is the threshold voltage of operation of an FET) level logic signals.

Figure 3:
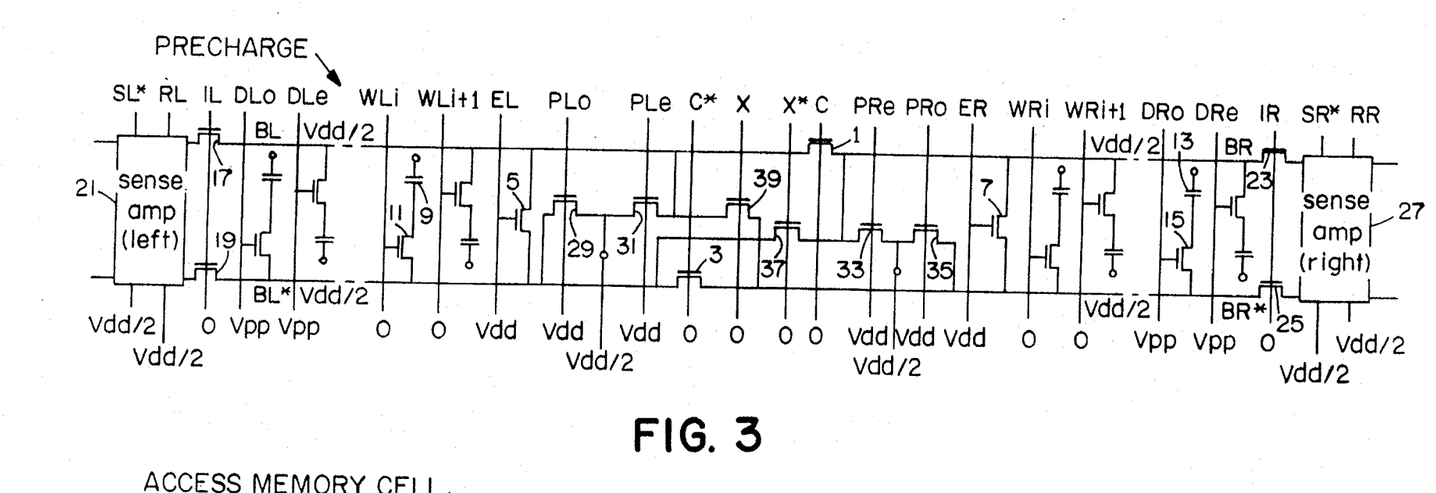
FIGS. 3–12 are schematic diagrams illustrating a DRAM bitline and ancillary circuitry, in sequential operational steps.

An FET 5 has its source-drain circuit connected between BL and BL*, and an FET 7 has its source-drain circuit connected between BR and BR*. When enabled by respective signals EL and ER, FETs 5 and 7 short circuit the corresponding left and right conductor pairs.

A cell capacitor 9 is connected via the source-drain circuit of an FET 11 to BL* and a dummy capacitor 13 is connected via the source-drain circuit of an FET 15 to BR*. The gate of FET 11 is connected to a word line WLi and the gate of FET 15 is connected to a row line DRo. A signal WLi on the word line of the same name enables FET 9, thus allowing charge from BL* to be stored in capacitor 9 or charge stored in capacitor 9 to be dumped to BL*. Similarly A signal DRo on the word line of the same name enables FET 15, thus allowing charge from BR* to be stored in capacitor 13 or charge stored in capacitor 13 to be dumped to BR*.

Figure 14:
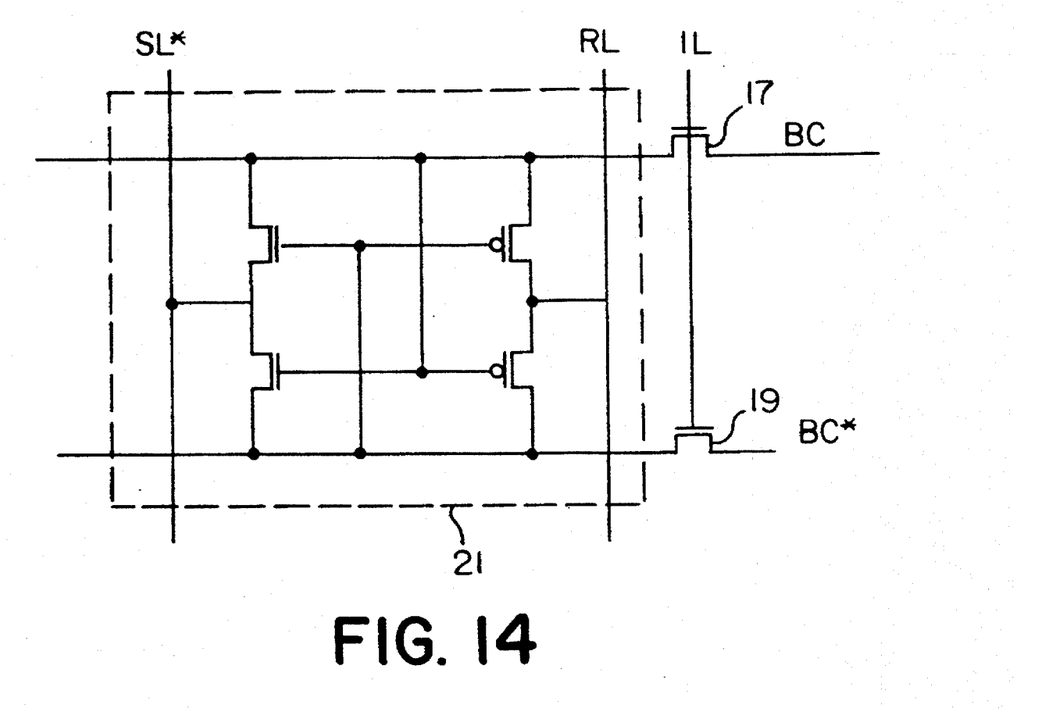
FIG. 14 is a schematic diagram of a sense amplifier.

The source-drain circuits of a pair of FETs 17 and 19 couple BL and BL* to a left sense amplifier 21 such as shown in FIG. 14, and the source-drain circuits of a pair of FETs 23 and 25 couple BR and Br* to a right sense amplifier 27 corresponding to the one shown in FIG. 14. The gates of FETs 17 and 19 are driven by an IL signal, and the gates of FETs 23 and 25 are driven by an IR signal. The source-drain circuits of a pair of FETs 29 and 31 are connected in series between BL* and BL, and their junction to a source of precharge voltage Vdd/2. The source-drain circuits of a pair of FETs 33 and 35 are connected in series between BR, and BR, and their junction to a source of precharge voltage Vdd/2. The gate of FET 29 is driven by a PLo signal, the gate of FET 31 is driven by an PLe signal, the gate of FET 33 is driven by a PRe signal and the gate of FET 35 is driven by a PRo signal.

The source-drain circuit of an FET 37 is connected between BL* and BR, and the source-drain circuit of an FET 39 is connected between BL and BR*. The gate of FET 37 is driven by an X* signal and the gate of FET 39 is driven by an X signal.

While the above-described circuit is used in the description of the invention below, other circuitry connected to the various folded bitline conductors may be used, as shown in the figure. However, as they do not take part in the particular description of how the value of a bit which may take one of four values is sensed, they will not be referred to. The structure of a folded bitline, ancillary circuitry and circuitry connected to other conductors of the bitline will be understood by a person skilled in the art, and a discussion of that extra circuitry is believed to be redundant. It is also understood that a person skilled in the art understands the manner of operation of the invention described in U.S. Pat. No. 5,283,761 which is incorporated herein by reference.

A convention will also be used in this specification, wherein when an element or voltage is the to be high, this means that high logic level is applied. High logic level is considered to be Vdd, unless otherwise noted. When an element or voltage is the to be low, this means that low logic level is applied. Low logic level is considered to be 0 or Vss, unless otherwise noted.

Figure 10:
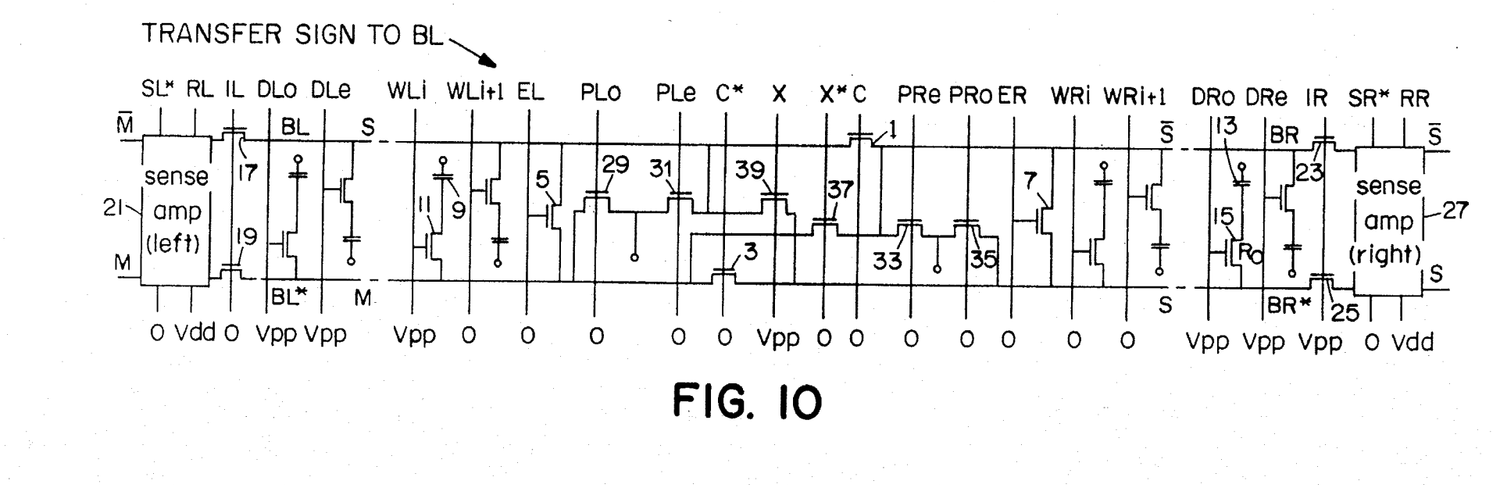
Figure 11:
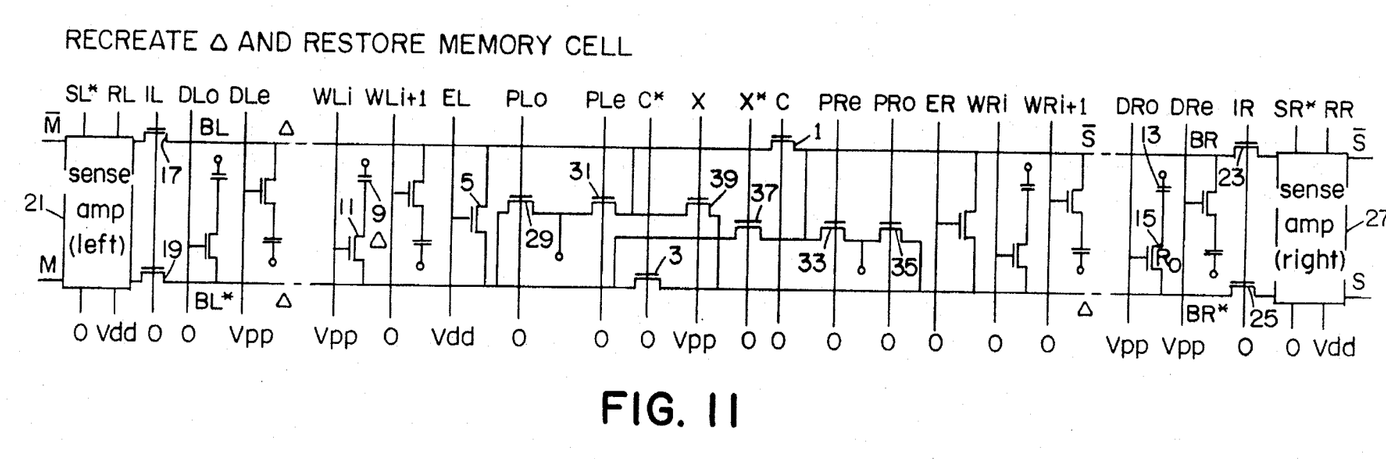
Figure 12:
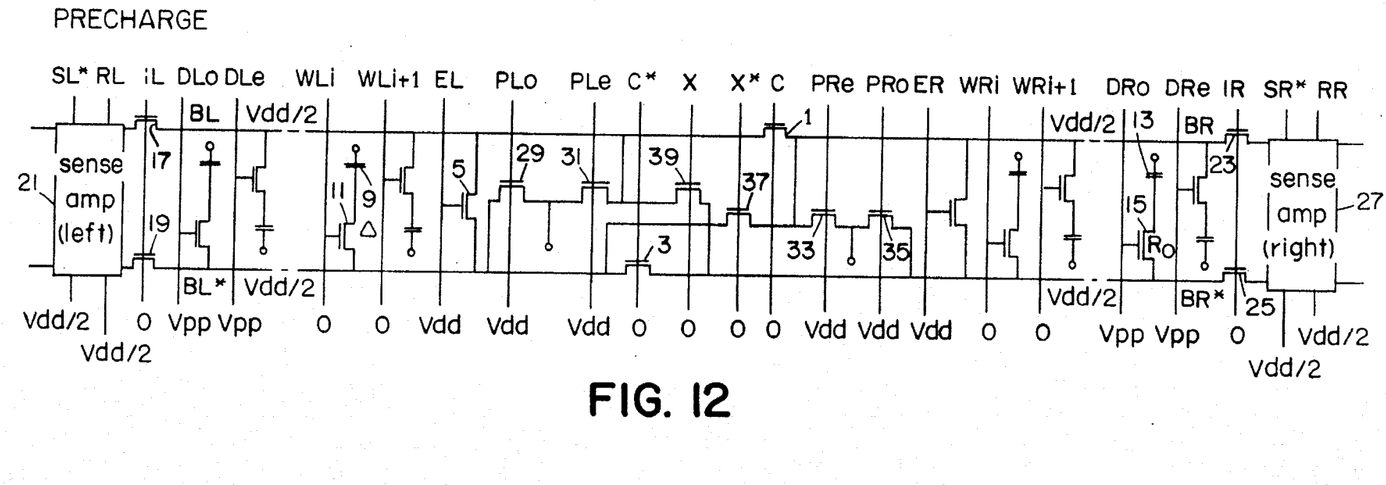
Figure 13:
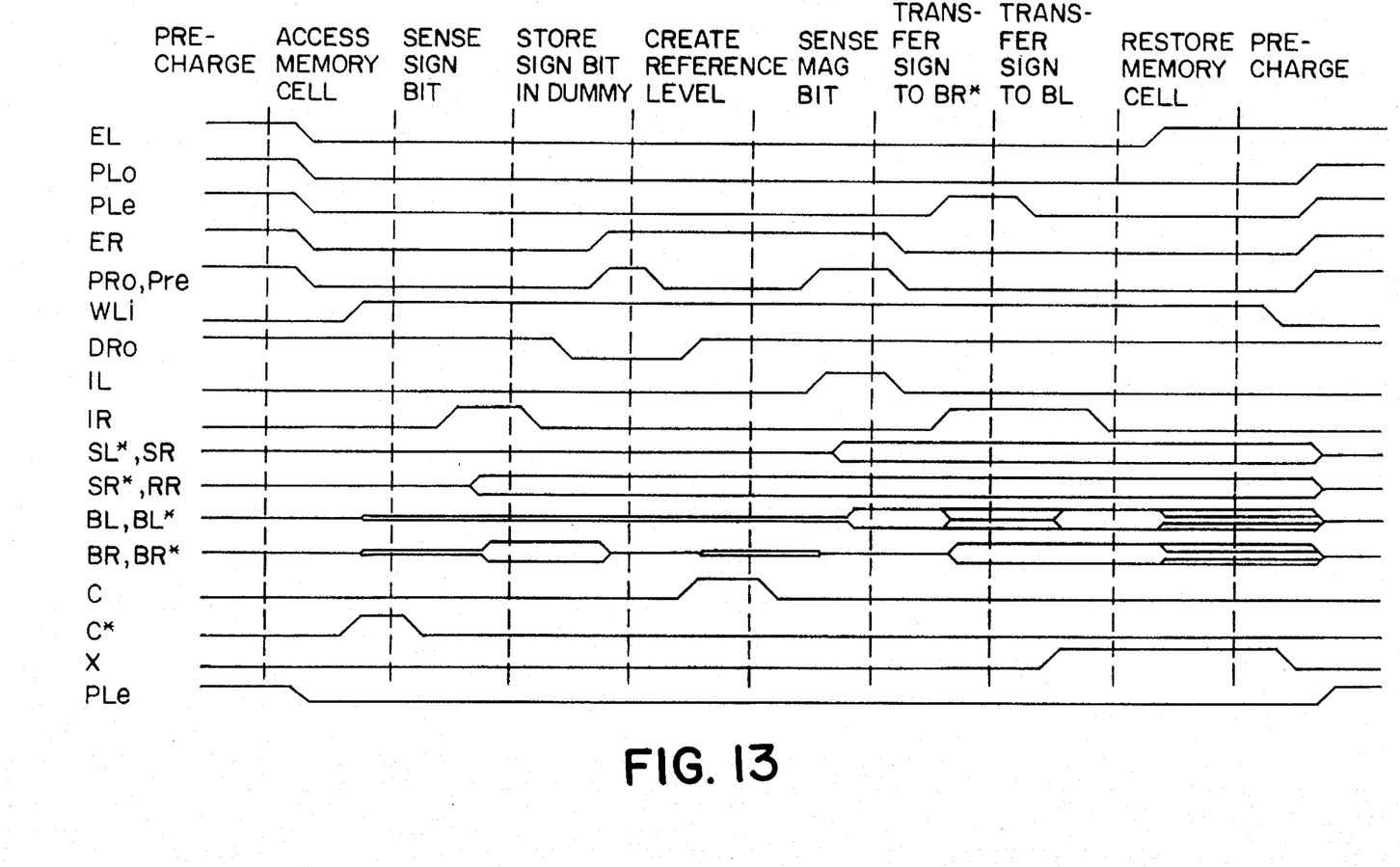
FIG. 13 is a timing diagram of signals in the circuitry of FIGS. 3–12

A description of operation of the present invention will follow, with reference to each of FIGS. 3–13, but all in conjunction with FIGS. 12 and 13. Each labelled vertical segment of FIG. 12 is a stage corresponding to one of FIGS. 1–13.

FIG. 3 illustrates a first stage in a reading cycle, a precharge stage. In this case DLo, DLe, DRo, Dre, EL, PLo, PLe, PRe, PRo and ER are the only inputs that are high, the others shown in FIG. 12 being low. Dummy word lines DLo, DLe, DRo and DRe have the value Vpp when high. As a result, each of the conductor pairs BL and BL* and BR and BR* is isolated from the other pair, the conductor pairs BL and BL* are connected together through FET 5, and conductor pairs BR and BR* are connected together through FET 7. Precharge voltage is applied through FETs 29 and 31 to BL* and BL, and precharge voltage is applied through FETs 33 and 35 to BR and BR*.

As a result, BL, BL*, BR and BR* and the dummy cell capacitors become precharged to voltage Vdd/2.

Figure 4:
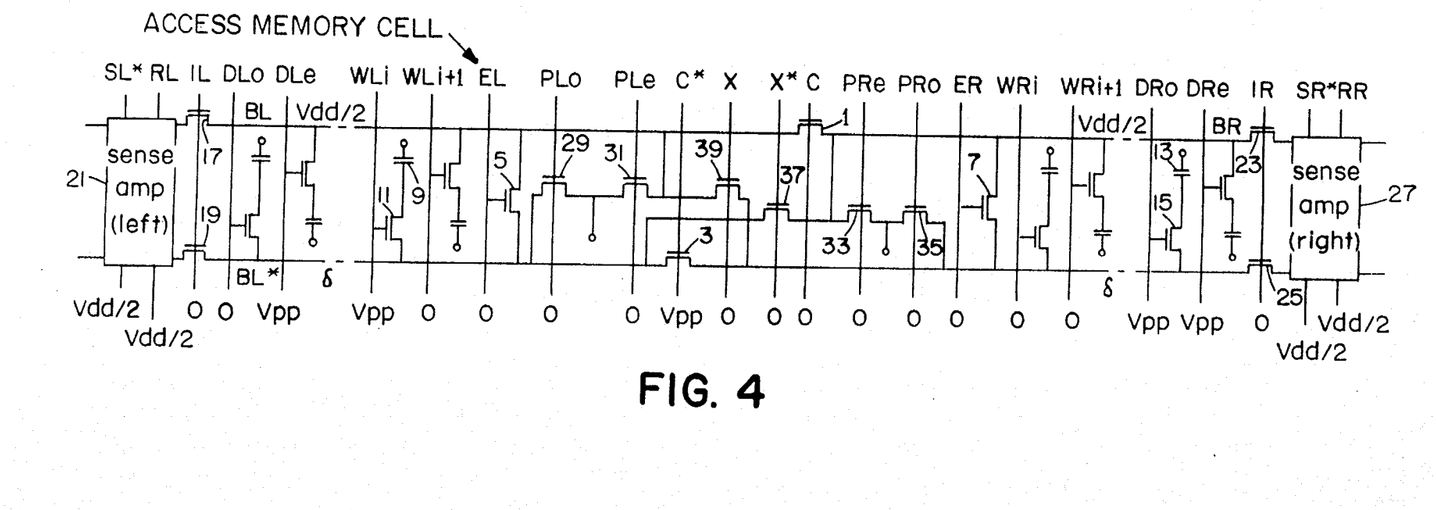

In the second stage, shown in FIG. 4, the DLo, EL, PLo, PLe, PRe, PRo and ER inputs that were high, go low, and following, WLi and C* go high (to Vpp voltage) while DLe, DRe and DRo remain high. As a result, BL* and BR* are connected together, the dummy capacitor 13 is connected to BR* through FET 15, and capacitor 9 dumps its charge on BL*. The charge dumped on BL* passes to dummy capacitor 13, where it is shared. The resulting voltage on BL* and BR* is $$(\Delta - Vdd/2)Ccell/(Ccell+Cbl)+Vdd/2,$$

where Ccell is the capacitance of the charge storage capacitor 9, $\Delta$ is the initial voltage on capacitor 9, and Cbl is the capacitance of the bitline conductors BL* and BR* plus the capacitance of the dummy capacitor 13. The voltage on BL and BR is Vdd/2.

Figure 5:
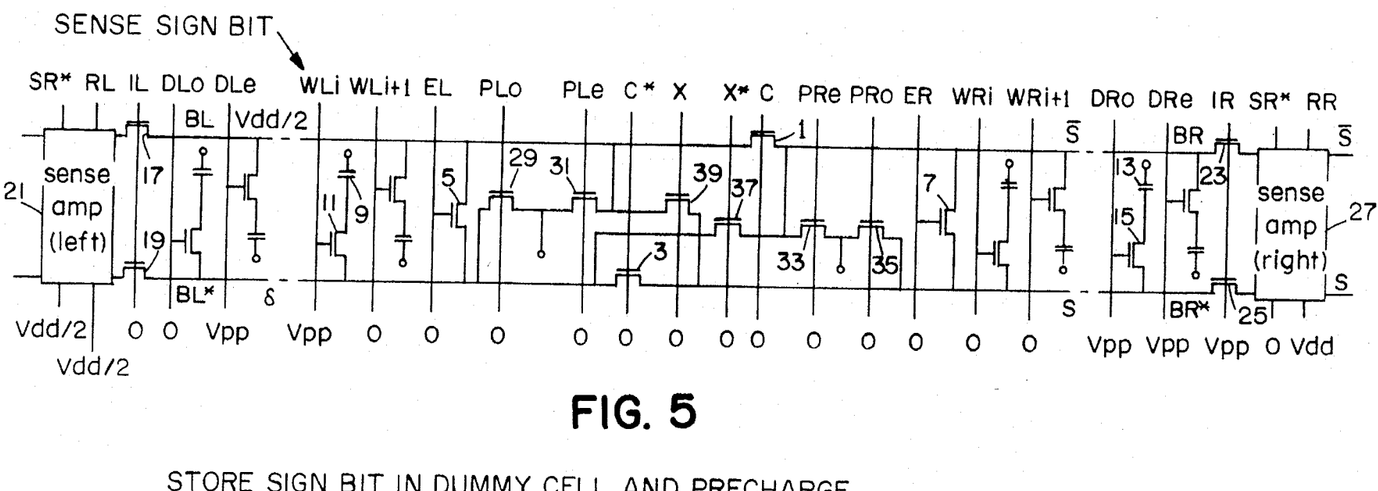

In the next stage, shown in FIG. 5 Wli and DRo are still high, and thus capacitors 9 and 13 are still coupled to BL* and BR*. However, C* has gone low. Now IR goes high (to Vpp), and SR* is forced to Vss and RR is forced to Vdd to allow the right sense amplifier 27 to sense BR*, i.e. whether it is higher or lower than Vdd/2 which is carried by BR. As a result, the BR and BR* conductors are brought to full logic level /S and S, with polarity on BR and BR* depending on whether the voltage on BR was higher or lower than Vdd/2. This logic level is indicative of the sign of the bit originally stored by capacitor 9, and appears on the outputs SR* and RR of the right sense amplifier 27.

With the DRo signal high, the value of the logic level on the BR* conductor is stored in the dummy capacitor 13, through FET 15. The sense amplifier 27 maintains the sign bit sense logic levels on its output leads SR* and SR.

Figure 6:
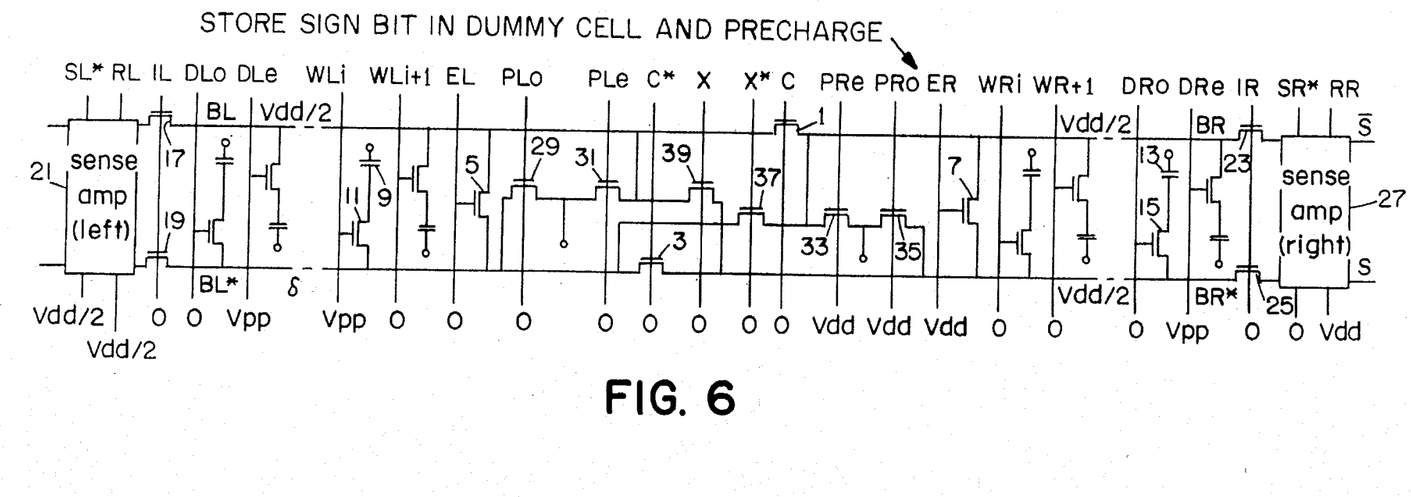

FIG. 6 illustrates the next stage in the cycle, in which the DRo and IR signals go low, and the ER, PRo and PRe signals go high. As a result, BR and BR* are connected together through FET 7, and a precharge voltage Vdd/2 is applied to BR and BR*. Each of the conductors BL, BR and BR* now carry the precharge voltage Vdd/2. The value of the sign bit is stored in dummy capacitor 13.

Figure 7:
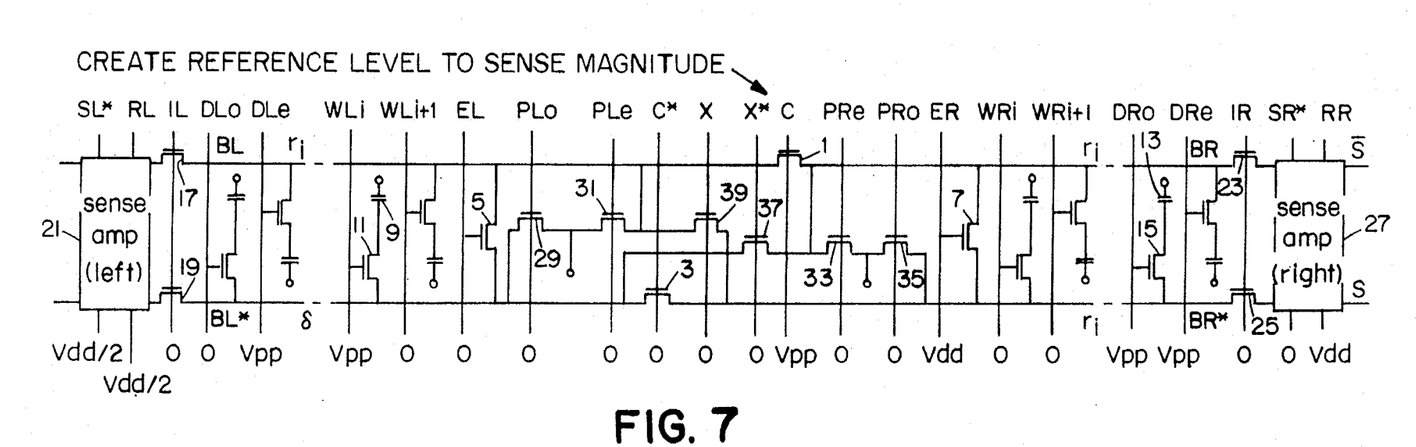

The next stage is illustrated in FIG. 7. The signal C goes high, to Vpp or Vdd, causing the BL and BR leads to be connected together through FET 1. The Pre and PRo signals go low, disconnecting Vdd/2. The ER signal remains high, causing BR and BR*, to be connected together through FET 7. Thus all of BL, BR and BR* are connected together. DRo then goes high, to Vpp, causing dummy capacitor 13 to dump its charge on BR*, which is shared to BL, BR and BR*, resulting in a shared voltage ri thereon:

$$ri = (Ri - Vdd/2)(Ccell/Ccell + Cbl) + Vdd/2$$

This voltage is the reference level against which the magnitude of the voltage on BL* will be measured in the following stage. Ri representing the equivalent cell-reference voltage, will be 5Vdd/6 for sign bit=1, and Vdd/6 for sign bit=0.

Figure 8:
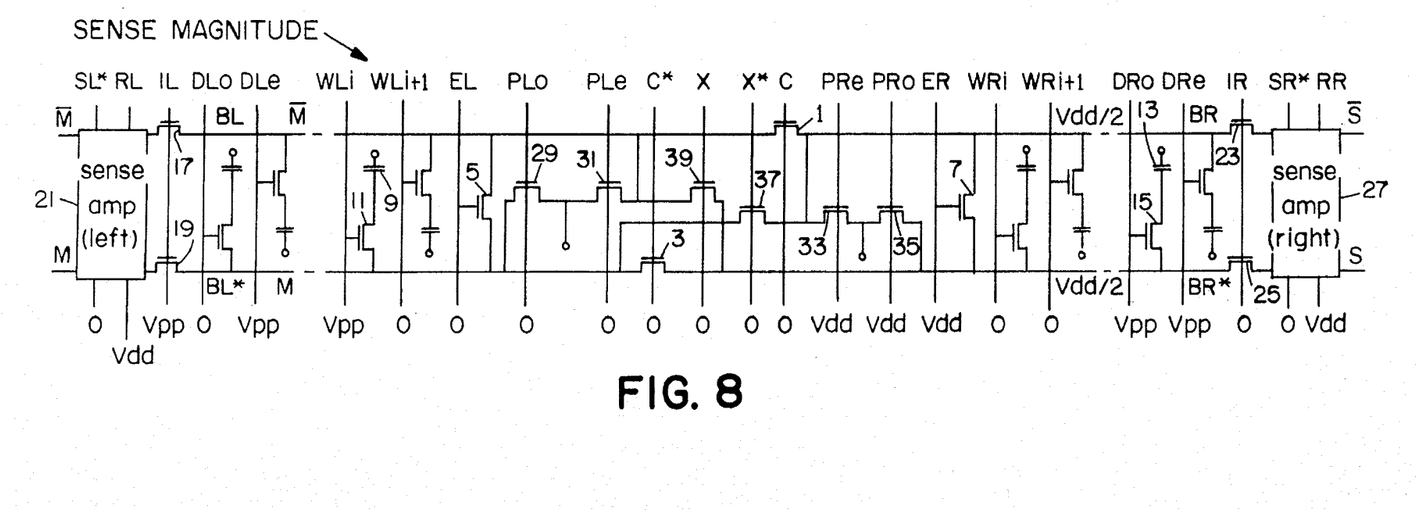

The next stage is illustrated in FIG. 8. The signal C has gone low, disabling FET 1 and thus disconnecting BL and BR from each other. PRe, PRo and ER go high, and DRo remains high, at Vpp. Thus, in a manner as described earlier, Vdd/2 precharge voltage is applied to BR, BR* and the dummy capacitor 13.

IL goes high, to Vpp, thus connecting BL and BL* to the left sense amplifier 21. SL* and RL are asserted to enable sense amplifier 21 to sense the voltage value on BL* against the ri voltage on BL, and applies full logic level /M and M to the bitline conductors BL and BL*. This polarity of this logic level is indicative of the magnitude of the bit voltage level originally stored in capacitor 9.

Thus the circuit has obtained the sign and magnitude of the bit value of the possible four voltage levels originally stored in capacitor 9, and has provided the bit values at the outputs of sense amplifiers 27 and 21, as indicated in the table noted above.

At this point, the BL and BL* conductors carry full logic levels /M and M, and BR and BR* have been precharged to Vdd/2. The dummy capacitor, being connected to BR*, is charged to the precharge voltage Vdd/2.

Figure 9:
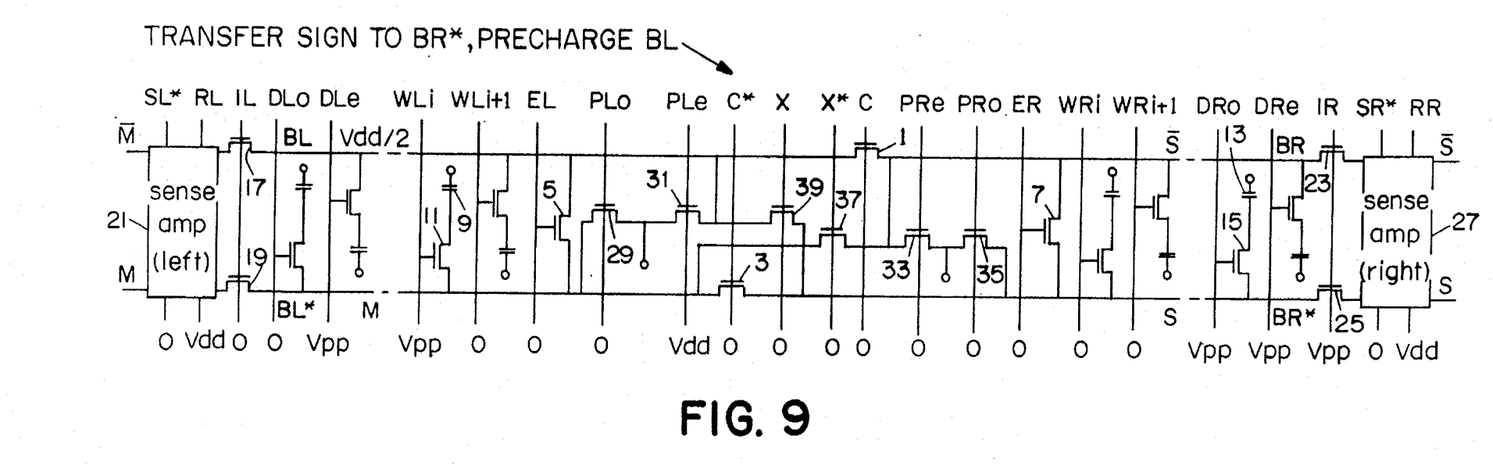

ER then goes low, unshorting BR and BR*. PRo and PRe go low, disconnecting the precharge voltage supply from BR and BR*. IL goes low, disconnecting BL and BL* from sense amplifier 21. PLe goes high, raising or dropping BL to Vdd/2 via FET 31. BL* is still at the previous sensed logic level. IR goes high, connecting BR and BR* to the sense amplifier 27. BR and BR*, sensed, go to logic level 0, 1 (0, Vdd), respectively, depending on the value of the sign bit.

In the next stage, as shown in FIG. 10, PLe goes low, disconnecting Vdd/2 from BL. X goes high, cross-connecting BL to BR*. Thus the voltage that was on BR* is transferred to BL, i.e. the full logic level sign bit 0 or 1. Thus the sign bit has been transferred to BL. IR goes low to disconnect the sense amplifier from bitlines BR, BR*.

In FIG. 11, EL goes high, causing connection of BL and BL* together. With X being high, BR* is connected to BL. Therefore BR*, BL and BL* share charge. The sign magnitude /S remains on BR. WLi, which has remained high, connects the charge storage cell capacitor to BL*, and the shared charge, which is the value of Δ as indicated in the table, is stored in capacitor 9. The memory cell has thus been restored.

In a last stage, which places the circuit in the same state as the first stage, WLi goes low, and the DLo, PLo, PLe, ER, PRo and PRe signals go high. BR and BR* are connected together and to Vdd/2, and BL and BL* are connected together and to Vdd/2. Capacitor 9 is isolated from BL*, and the sense amplifiers are isolated from BR, BR*, BL and BL*. The bitline conductors are thus precharged to Vdd/2.

It should be noted that while storage sensing and restoration of data stored in a particular cell capacitor has been described, data stored in any DRAM charge storage capacitor may similarly be sensed and restored.

It may be seen that in the present invention, the sign and magnitude bits are generated in a positive and unconditional manner. The sign bit and the magnitude bit are first sensed in successive sensing operations. The data, represented by two digital bits, is then restored to the memory cell as one of four levels.

In summary, a reference level for sensing has been created by dumping the charge from a cell containing the sign bit to three sub-bitlines, which is equivalent to dumping a stored voltage Vdd/6 or 5Vdd/6 reference level onto two sub-bitlines.

This may be realized by the voltage values for the reference levels being:

let $C_b = C_{sub\text{-}bitline} + C_{cell}$ $$\left(Vdd - \frac{Vdd}{2}\right)\frac{Cs}{3Cb} + \frac{Vdd}{2} = \left(\frac{5Vdd}{6} - \frac{Vdd}{2}\right)\frac{Cs}{2Cb} + \frac{Vdd}{2}$$

or $$\left(-\frac{Vdd}{2}\right)\frac{Cs}{3Cb} + \frac{Vdd}{2} = \left(\frac{Vdd}{6} - \frac{Vdd}{2}\right)\frac{Cs}{2Cb} + \frac{Vdd}{2}$$

A person understanding this invention may now conceive of alternative structures and embodiments or variations of the above. All of those which fall within the scope of the claims appended hereto are considered to be part of the present invention.

What is claimed is:

1. A dynamic random access memory able to store one of multiple levels in each of a plurality of memory cells comprising:

columns of memory cells comprising storage capacitors coupled to bitlines through switches for reading and writing data from and to the memory cells, the bitlines being divided into subbitlines by switches therebetween, and subbitlines of adjacent bitlines being coupled by switches;

voltage sensors coupled to adjacent bitline pairs; and a dummy capacitor matching a storage capacitor coupled to each subbitline through a switch, the dummy capacitors being selectively connected to the subbitlines such that each subbitline capacitance matches the capacitance of a subbitline having a storage capacitor connected thereto;

subbitlines being selectively connected through switches, and storage capacitors and dummy capacitors being selectively connected to subbitlines through switches, such that:

a stored charge is dumped from a storage capacitor to a subbitline and through a switch to another capacitively matched subbitline to establish a sensing voltage on plural subbitlines; and a sense reference voltage is generated by dumping a charge from a capacitor onto plural capacitively matched subbitlines.

2. A dynamic random access memory as claimed in claim 1 wherein, prior to connecting a storage capacitor to a subbitline, the subbitline is precharged with a dummy capacitor connected thereto and the dummy capacitor is disconnected from the subbitline with the precharge thereon.

3. A dynamic random access memory as claimed in claim 1 wherein the reference voltage is generated from charge dumped from said storage capacitor.

4. A dynamic random access memory as claimed in claim 1 wherein each subbitline is coupled through switches to each adjacent subbitline and to each diagonal subbitline of a bitline pair.

5. A dynamic random access memory as claimed in claim 1 wherein a voltage to be written to a storage capacitor is generated by charging plural subbitlines with capacitors to high or low voltage levels and connecting the subbitlines to share charge, the number of subbitlines thus charged being dependent on the binary weights of multiple bits corresponding to the multiple levels, and the voltage levels being dependent on the bit values corresponding to the multi-level voltage to be stored.

6. A dynamic random access memory as claimed in claim 1 for storing one of four levels in each of the memory cells, each bitline being divided into two subbitlines and a sensor being coupled to each bitline pair at each end thereof.

7. A dynamic random access memory as claimed in claim 6 wherein a voltage to be written to a storage capacitor is generated by storing charge corresponding to the value of a sign bit onto two subbitlines and storing the charge corresponding to the value of a magnitude bit onto one subbitline and by connecting the three subbitlines to share the charges.

8. A dynamic random access memory as claimed in claim 6 wherein the reference is generated by dumping a charge corresponding to the sign bit onto three subbitlines.

9. A method of processing a stored value having one of multiple voltage levels in a dynamic random access memory comprising:

dumping a stored charge from a storage capacitor onto plural capacitively matched subbitlines to provide a sensing voltage;

sensing the voltage level of the sensing voltage relative to a first reference level;

generating a second reference level by dumping a charge from a capacitor onto plural capacitively matched subbitlines; and sensing the level of the sensing voltage relative to the second reference level.

10. A method as claimed in claim 9 wherein, prior to connecting a storage capacitor to a subbitline, the subbitline is precharged with a dummy capacitor connected thereto and the dummy capacitor is disconnected from the subbitline with the precharge thereon.

11. A method as claimed in claim 9 wherein the reference voltage is generated from charge dumped from the storage capacitor.

12. A method as claimed in claim 9 wherein each subbitline is coupled through switches to each adjacent subbitline and to each diagonal subbitline of a bitline pair.

13. A method as claimed in claim 9 wherein a voltage to be written to a storage capacitor is generated by charging plural subbitlines with capacitors to high or low voltage levels and connecting the subbitlines to share charge, the number of subbitlines thus charged being dependent on the binary weight of each bit of multiple bits corresponding to the multiple levels, and the voltage levels being dependent on the bit values corresponding to the multi-level voltage to be stored.

14. A method as claimed in claim 9 wherein the stored charge is one of four levels and each bitline is divided into two subbitlines and further comprising sensing sign and magnitude bits with respective sensors coupled to each bitline pair at opposite ends thereof.

15. A method as claimed in claim 14 wherein a voltage to be written to a storage capacitor is generated by storing charge corresponding to the value of a sign bit onto two subbitlines and storing the charge corresponding to the value of a magnitude bit onto one subbitline and by connecting the three subbitlines to share the charge.

16. A method as claimed in claim 14 wherein the reference is generated by dumping a charge corresponding to the sign bit onto three subbitlines.

17. A dynamic random access memory comprising:

columns of memory cells comprising storage capacitors coupled to bitlines through switches for reading and writing data from and to the memory cells;

voltage sensors coupled to adjacent bitline pairs; and a dummy capacitor matching a storage capacitor coupled to each bitline through a switch, the bitline being precharged with a dummy capacitor connected thereto and the dummy capacitor being disconnected from the bitline with the precharge thereon prior to connecting a storage capacitor to the bitline.

18. A method as claimed in claim 17 wherein the random access memory stores one of multiple levels in each of the memory cells.

19. A method of processing a stored value stored in a dynamic random access memory comprising:

precharging a bitline with a dummy capacitor connected thereto and then disconnecting the dummy capacitor from the bitline;

dumping a stored charge from a storage capacitor onto the bitline to provide a sensing voltage; and sensing the voltage level of the sensing voltage relative to a reference level.

20. The method as claimed in claim 19 wherein one of multiple voltage levels is stored in each memory cell.

21. A method as claimed in claim 19 wherein one of four voltage levels is stored in each memory cell and the bitlines are divided into subbitlines connected by switches.

22. A dynamic random access memory able to store one of multiple levels in each of a plurality of memory cells comprising:

columns of memory cells comprising storage capacitors coupled to bitlines through switches for reading and writing data from and to the memory cells, the bitlines being subdivided into subbitlines by switches therebetween, and subbitlines of adjacent bitlines being coupled by switches;

voltage sensors coupled to adjacent bitline pairs; and a dummy capacitor matching a storage capacitor coupled to each subbitline through a switch, subbitlines being selectively connected through switches, and storage capacitors and dummy capacitors being selectively connected to subbitlines through switches, such that:

a stored charge is dumped from a storage capacitor to a subbitline and through a switch to another capacitively matched subbitline to establish a sensing voltage on plural subbitlines; and a sense reference voltage is generated by dumping a charge from said storage capacitor onto plural subbitlines.

23. A method of processing a stored value having one of multiple voltage levels in a dynamic random access memory comprising:

dumping a stored charge from a storage capacitor onto plural subbitlines to provide a sensing voltage;

sensing the voltage level of the sensing voltage relative to a first reference level;

generating a second reference level by dumping a charge from said storage capacitor onto plural subbitlines; and sensing the level of the sensing voltage relative to the second reference level.

24. A method as claimed in claim 23 wherein one of four voltage levels is stored in each memory cell.

* * * * *